(12) United States Patent
Lacy

(10) Patent No.: US 9,198,307 B1
(45) Date of Patent: Nov. 24, 2015

(54) CARRYING CASE ASSEMBLY

(71) Applicant: Leondaus Lacy, Woodland Hills, CA (US)

(72) Inventor: Leondaus Lacy, Woodland Hills, CA (US)

( * ) Notice: Subject to any disclaimer, the term of this patent is extended or adjusted under 35 U.S.C. 154(b) by 0 days.

(21) Appl. No.: 14/179,881

(22) Filed: Feb. 13, 2014

(51) Int. Cl.
*A45F 5/00* (2006.01)
*B65D 85/00* (2006.01)
*H05K 5/00* (2006.01)
*G06F 1/16* (2006.01)

(52) U.S. Cl.
CPC .............. *H05K 5/0086* (2013.01); *A45F 5/00* (2013.01); *G06F 1/163* (2013.01); *G06F 1/1628* (2013.01)

(58) Field of Classification Search
CPC .......... G06F 1/1628; G06F 1/163; A45F 5/00
USPC .......... 206/305, 320; 224/191, 217, 218, 267, 224/270–272, 929, 930; 361/679.55; 455/575.1
See application file for complete search history.

(56) References Cited

U.S. PATENT DOCUMENTS

| | | | |
|---|---|---|---|
| 1,174,887 A * | 3/1916 | Meriwether | 206/818 |
| 2,528,456 A * | 10/1950 | Stevenson | 602/22 |
| 4,791,408 A | 12/1988 | Heusinkveld | |
| 5,648,757 A * | 7/1997 | Vernace et al. | 206/320 |
| D433,017 S | 10/2000 | Martinez | |
| 6,292,674 B1 | 9/2001 | Davis | |
| 6,625,283 B1 | 9/2003 | Sato | |
| 6,822,852 B2 | 11/2004 | Von Novak | |
| 7,428,143 B1 * | 9/2008 | Jones et al. | 224/929 |
| 7,522,937 B2 | 4/2009 | Tanaka | |
| D624,064 S | 9/2010 | Esposito | |
| 8,428,664 B1 * | 4/2013 | Wyers | 455/575.1 |
| 8,528,798 B2 * | 9/2013 | Chen | 224/217 |
| 8,579,112 B2 * | 11/2013 | Bethea | 206/320 |
| 8,584,847 B2 * | 11/2013 | Tages et al. | 206/320 |
| 8,690,210 B1 * | 4/2014 | May | 224/217 |
| D716,287 S * | 10/2014 | Ambriz | D14/253 |
| 2002/0163504 A1 | 11/2002 | Pallakoff | |
| 2009/0044825 A1 * | 2/2009 | Lawrence et al. | 224/218 |
| 2012/0031937 A1 * | 2/2012 | Baker | 224/217 |
| 2014/0151417 A1 * | 6/2014 | Gayler | 224/217 |
| 2014/0313118 A1 * | 10/2014 | Brown et al. | 224/218 |

* cited by examiner

*Primary Examiner* — Luan K Bui

(57) ABSTRACT

A carrying case assembly for one-handed texting on an electronic device includes a housing that may contain an electronic device. A display opening extends through the housing. The electronic device is aligned with the display opening. A tubular portion of the housing may receive a user's finger so the user grips the housing. A thumb aperture extends through the housing. The thumb aperture is may insertably receive the user's thumb.

1 Claim, 3 Drawing Sheets

CARRYING CASE ASSEMBLY

BACKGROUND OF THE DISCLOSURE

Field of the Disclosure

The disclosure relates to carrying case devices and more particularly pertains to a new carrying case device for one-handed texting on an electronic device.

SUMMARY OF THE DISCLOSURE

An embodiment of the disclosure meets the needs presented above by generally comprising a housing that may contain an electronic device. A display opening extends through the housing. The electronic device is aligned with the display opening. A tubular portion of the housing may receive a user's finger so the user grips the housing. A thumb aperture extends through the housing. The thumb aperture is may insertably receive the user's thumb.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF THE DRAWINGS

The disclosure will be better understood and objects other than those set forth above will become apparent when consideration is given to the following detailed description thereof. Such description makes reference to the annexed drawings wherein.

DESCRIPTION OF THE PREFERRED EMBODIMENT

Figure 1:
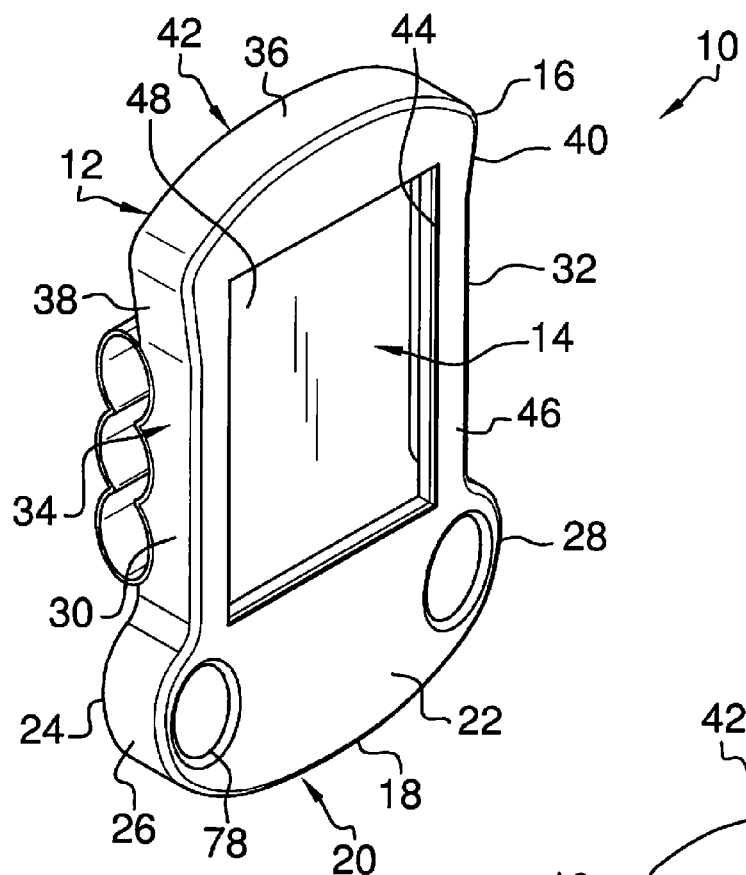
FIG. 1 is a perspective view of a carrying case assembly according to an embodiment of the disclosure.
Figure 2:
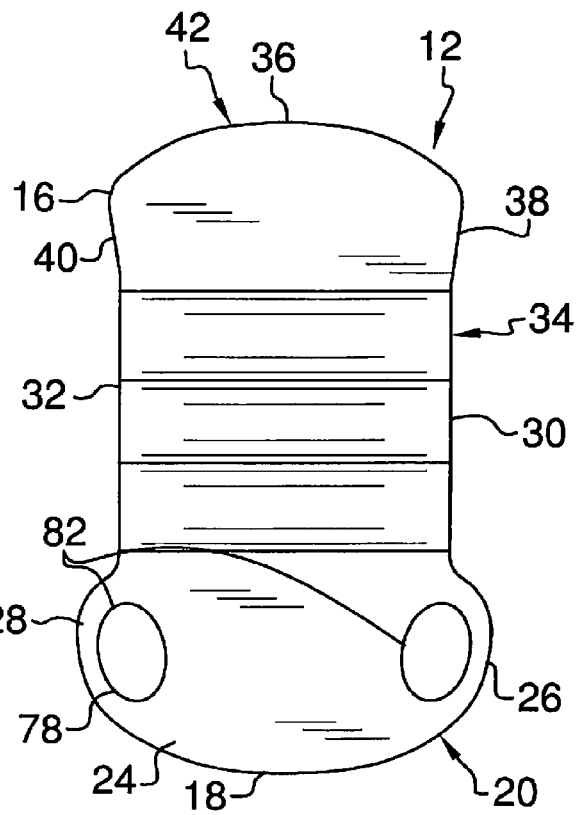
FIG. 2 is a back view of an embodiment of the disclosure.
Figure 3:
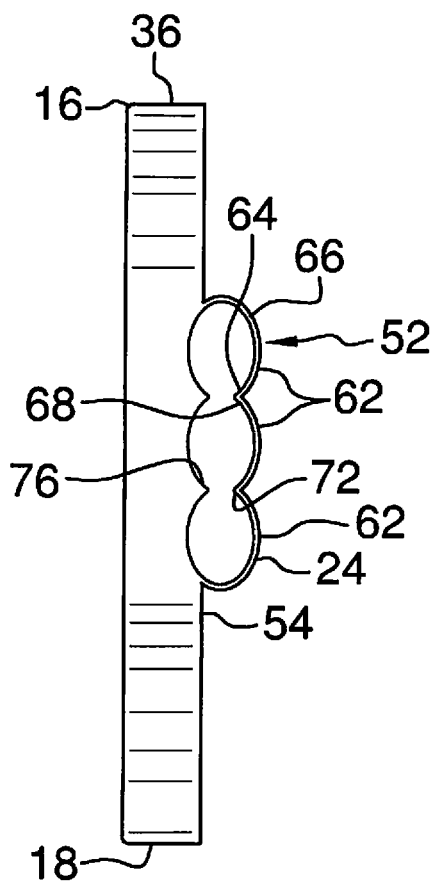
FIG. 3 is a right side view of an embodiment of the disclosure.
Figure 4:
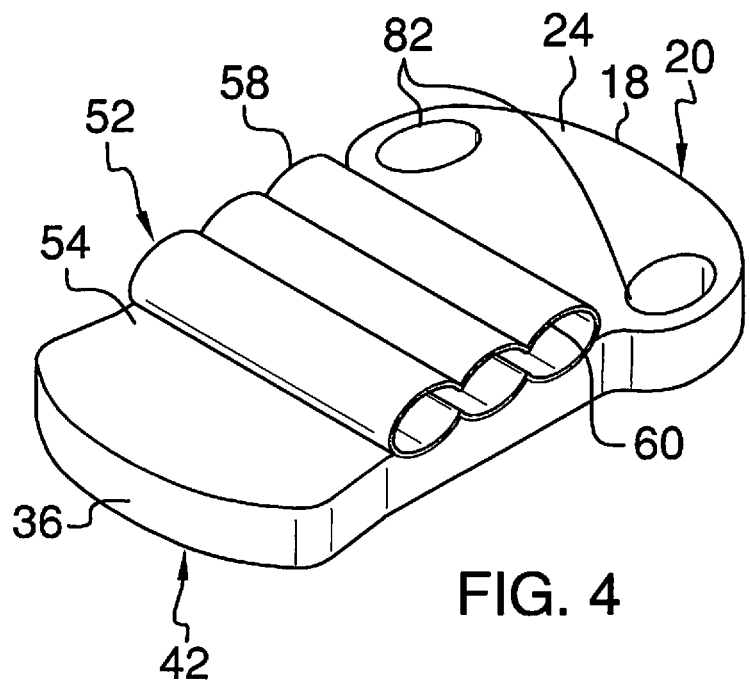
FIG. 4 is a back perspective view of an embodiment of the disclosure.
Figure 5:
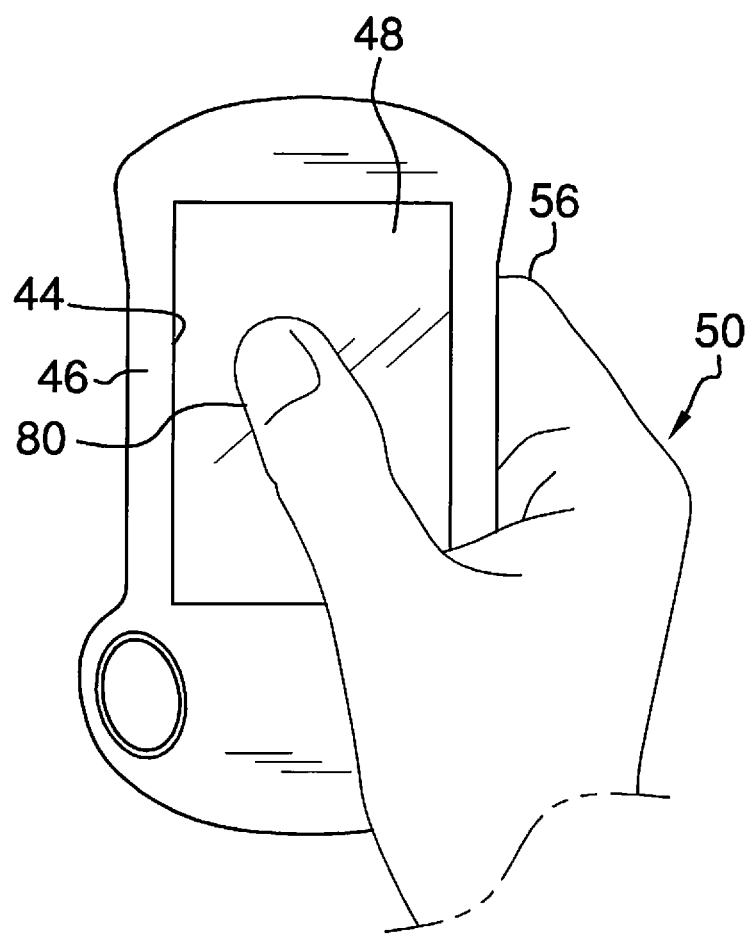
FIG. 5 is an in-use view of an embodiment of the disclosure.

With reference now to the drawings, and in particular to FIGS. 1 through 5 thereof, a new carrying case device embodying the principles and concepts of an embodiment of the disclosure and generally designated by the reference numeral 10 will be described.

As best illustrated in FIGS. 1 through 5, the carrying case assembly 10 generally comprises a housing 12 that may contain an electronic device 14. The electronic device 14 may be a smartphone of any conventional design. An outer wall 16 of the housing 12 has a height is greater than a width of the housing. Further, the housing 12 has a rectangular parallelepiped shape that may have a width between 7 cm and 15 cm, a height between 12 cm and 18 cm and a depth between 12 mm and 20 mm. Lastly, the housing 12 may be comprised of a resiliently deformable material such as rubber or other similar material.

A bottom edge 18 of the outer wall 16 of the housing 12 is curved. Moreover, a bottom portion 20 of the housing 12 has an ovoid cross section taken along a longitudinal axis extending through a front side 22 and a back side 24 of the bottom portion 20 of the housing 12. Each of a first lateral side 26 and a second lateral side 28 of the bottom portion 20 of the housing 12 extends outwardly from an associated one of a first lateral side 30 and a second lateral side 32 of a central portion 34 of the housing. The bottom portion 20 of the housing 12 may have a width between 10 cm and 15 cm and height between 3 cm and 5 cm. Lastly, the central portion 34 of the housing 12 may have a width between 7 cm and 10 cm and a height between 8 cm and 11 cm.

A top edge 36 of the outer wall 16 of the housing 12 is curved. Additionally, a first lateral side 38 and a second lateral side 40 of a top portion 42 of the housing 12 angles outwardly from an associated one of the first 30 and second 32 lateral sides of the central portion 34 of the housing 12. The top portion 42 of the housing 12 may have a height between 1 cm and 3 cm. Lastly, the top portion 42 of the housing 12 may have a width between 9 cm and 12 cm.

A display opening 44 extends through a front side 46 of the outer wall 16 of the housing 12. The display opening 44 is positioned on the central portion 34 of the housing 12. Moreover, a display 48 on the electronic device 14 is aligned with the display opening 44 so the display 48 is accessible to a user 50. The display opening 44 may have a width between 6 cm and 14 cm and a height between 8 cm and 11 cm.

A tubular portion 52 of the housing 12 is coupled to a back side 54 of the outer wall 16 of the housing 12. The tubular portion 52 of the housing 12 extends between the first 30 and second 32 lateral sides of the central portion 34 of the housing 12. Moreover, the tubular portion 52 of the housing 12 may receive the user's finger 56 so the user 50 grips the housing 12. The tubular portion 52 of the housing 12 has a height that is greater than a width of the tubular portion 52 of the housing 12. Continuing, the tubular portion 52 of the housing 12 has an ovoid cross section taken along a longitudinal axis extending through an open first end 58 and an open second end 60 of the tubular portion 52 of the housing 12. Lastly, the tubular portion 52 of the housing 12 may have a height between 12 mm and 25 mm and a width between 6 mm and 12 mm.

The tubular portion 52 of the housing 12 is one of a plurality of the tubular portions 62 of the housing 12. Continuing, the plurality of tubular portions 62 of the housing 12 is evenly distributed between the top portion 42 of the housing 12 and the bottom portion 20 of the housing 12. A bottom side 64 of a top one of the plurality of tubular portions 66 of the housing 12 opens into a top side 68 of a middle one of the plurality of tubular portions 70 of the housing 12. Additionally, a top side 72 of a bottom one of the plurality of tubular portions 74 of the housing 12 opens into a bottom side 76 of the middle tubular portion 70 of the housing 12.

A thumb aperture 78 extends through the front 22 and back 24 sides of the bottom portion 20 of the housing 12. The thumb aperture 78 may insertably receive the user's thumb 80. Moreover, the thumb aperture 78 has a height that is greater than a width of the thumb aperture 78. The thumb aperture 78 has an ovoid shape that may have a height between 12 mm and 25 mm and a width between 6 mm and 12 mm. Additionally, the thumb aperture 78 is one of a pair of the thumb apertures 82. Each of the pair of thumb apertures 82 is positioned proximate an associated one of the first 26 and second 28 lateral sides of the bottom portion 20 of the housing 12.

In use, the electronic device 14 is positioned within the housing 12. The user 50 inserts each of the user's fingers 56 within an associated one of the plurality of tubular portions 62 of the housing 12. Continuing, the user's thumb 80 is used to text in the convention of texting on a Smartphone. The assembly 10 allows the user 50 to comfortably text with one hand without fear of dropping the electronic device 14.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A carrying case assembly for one-handed texting on an electronic device, said assembly comprising:

a housing configured to contain the electronic device, an outer wall of said housing having a height being greater than a width of said housing wherein said housing has a rectangular parallelepiped shape, a bottom edge of an outer wall of said housing being curved wherein a bottom portion of said housing has an ovoid cross section taken along a longitudinal axis extending through a front side and a back side of said bottom portion of said housing wherein each of a first lateral side and a second lateral side of said bottom portion of said housing extends outwardly from an associated one of a first lateral side and a second lateral side of a central portion of said housing;

a display opening extending through a front side of said outer wall of said housing wherein said display opening is positioned on said central portion of said housing wherein the electronic device is aligned with said display opening;

a tubular portion of said housing coupled to a back side of said outer wall of said housing wherein said tubular portion of said housing extends between said first and second lateral sides of said central portion of said housing wherein said tubular portion of said housing is configured to receive a user's finger wherein the user grips said housing;

said tubular portion of said housing having a height being greater than a width of said tubular portion of said housing wherein said tubular portion of said housing has an ovoid cross section taken along a longitudinal axis extending through an open first end and an open second end of said tubular portion of said housing, said tubular portion of said housing being one of a plurality of said tubular portions of said housing;

said plurality of tubular portions of said housing being evenly distributed between a top portion of said housing and said bottom portion of said housing;

a thumb aperture extending through said front and back sides of said bottom portion of said housing wherein said thumb aperture is configured to insertably receive the user's thumb;

said thumb aperture having a height being greater than a width of said thumb aperture wherein said thumb aperture has an ovoid shape, said thumb aperture being one of a pair of said thumb apertures; and each of said pair of thumb apertures being positioned proximate an associated one of said first and second lateral sides of said bottom portion of said housing.

\* \* \* \* \*